US012604406B2

(12) United States Patent
Shirota et al.

(10) Patent No.: US 12,604,406 B2
(45) Date of Patent: Apr. 14, 2026

(54) MULTILAYER ELECTRONIC SUBSTRATE

(71) Applicant: SONY GROUP CORPORATION, Tokyo (JP)

(72) Inventors: Kanahiro Shirota, Tokyo (JP); Keiichi Hirano, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 329 days.

(21) Appl. No.: 18/260,485

(22) PCT Filed: Dec. 23, 2021

(86) PCT No.: PCT/JP2021/047779
§ 371 (c)(1),
(2) Date: Jul. 6, 2023

(87) PCT Pub. No.: WO2022/153819
PCT Pub. Date: Jul. 21, 2022

(65) Prior Publication Data
US 2024/0064900 A1 Feb. 22, 2024

(30) Foreign Application Priority Data

Jan. 18, 2021 (JP) ................................. 2021-005820

(51) Int. Cl.
*H01R 12/62* (2011.01)
*H01R 12/71* (2011.01)
(Continued)

(52) U.S. Cl.
CPC ........... *H05K 1/148* (2013.01); *H01R 12/716* (2013.01); *H01R 12/722* (2013.01); *H01R 12/73* (2013.01);
(Continued)

(58) Field of Classification Search
CPC ............. H05K 1/148; H05K 2201/042; H05K 2201/10189; H05K 1/147; H05K 1/14; H01R 12/716; H01R 12/722; H01R 12/73
See application file for complete search history.

(56) References Cited

U.S. PATENT DOCUMENTS

| | | | | |
|---|---|---|---|---|
| 5,428,190 | A | * | 6/1995 | Stopperan .............. H05K 1/148 174/250 |
| 2004/0229402 | A1 | * | 11/2004 | Cady ...................... H05K 1/141 438/109 |

(Continued)

FOREIGN PATENT DOCUMENTS

| | | |
|---|---|---|
| JP | 06-325825 A | 11/1994 |
| JP | 07-023267 A | 1/1995 |

(Continued)

OTHER PUBLICATIONS

International Search Report and Written Opinion of PCT Application No. PCT/JP2021/047779, issued on Feb. 22, 2022, 09 pages of ISRWO.

*Primary Examiner* — Abdullah A Riyami
*Assistant Examiner* — Nelson R. Burgos-Guntin
(74) *Attorney, Agent, or Firm* — CHIP LAW GROUP

(57) ABSTRACT

Provided is a multilayer electronic substrate that includes a first substrate, a second substrate placed on the first substrate such that surfaces of the first and second substrates face each other, a first connector mounted on the surface of the first substrate and electrically connected to a first wire of the first substrate, a second connector mounted on the surface of the second substrate and electrically connected to a first wire of the second substrate, the second connector being directly connected to the first connector, and a wiring member having flexibility, the wiring member having one end electrically connected to a second wire of the first substrate and another end electrically connected to a second wire of the (Continued)

second substrate, to electrically connect the second wire of the first substrate and the second wire of the second substrate.

10 Claims, 7 Drawing Sheets

(51) Int. Cl.
    *H01R 12/72*           (2011.01)
    *H01R 12/73*           (2011.01)
    *H05K 1/14*            (2006.01)

(52) U.S. Cl.
    CPC .................. *H05K 2201/042* (2013.01); *H05K 2201/10189* (2013.01)

(56)            References Cited

U.S. PATENT DOCUMENTS

| | | | | |
|---|---|---|---|---|
| 2006/0258179 | A1* | 11/2006 | Watanabe | H05K 1/117 |
| | | | | 439/55 |
| 2007/0081309 | A1* | 4/2007 | Urushibara | H05K 1/147 |
| | | | | 361/748 |
| 2009/0084583 | A1* | 4/2009 | Ueno | H05K 3/4691 |
| | | | | 29/842 |
| 2010/0165594 | A1* | 7/2010 | Kim | H05K 1/147 |
| | | | | 361/809 |
| 2012/0319908 | A1* | 12/2012 | Tsutsumi | H01Q 1/243 |
| | | | | 343/702 |
| 2014/0217571 | A1* | 8/2014 | Ganesan | H01L 23/49811 |
| | | | | 257/693 |
| 2015/0163937 | A1* | 6/2015 | McClatchie | H05K 1/147 |
| | | | | 361/728 |
| 2016/0037640 | A1* | 2/2016 | Takai | H05K 1/0298 |
| | | | | 361/753 |
| 2019/0297726 | A1* | 9/2019 | Yazaki | H05K 1/11 |
| 2020/0120807 | A1* | 4/2020 | Park | G06F 3/04164 |
| 2020/0305282 | A1* | 9/2020 | Shin | H05K 1/148 |

FOREIGN PATENT DOCUMENTS

| | | | |
|---|---|---|---|
| JP | 2004-253523 | A | 9/2004 |
| JP | 2008-091776 | A | 4/2008 |
| JP | 2009-038121 | A | 2/2009 |

\* cited by examiner

MULTILAYER ELECTRONIC SUBSTRATE

CROSS REFERENCE TO RELATED APPLICATIONS

This application is a U.S. National Phase of International Patent Application No. PCT/JP2021/047779 filed on Dec. 23, 2021, which claims priority benefit of Japanese Patent Application No. JP 2021-005820 filed in the Japan Patent Office on Jan. 18, 2021. Each of the above-referenced applications is hereby incorporated herein by reference in its entirety.

TECHNICAL FIELD

The present technology (technology according to the present disclosure) relates to a multilayer electronic substrate, and particularly relates to a technology effective when applied to a multilayer electronic substrate having a plurality of connectors.

BACKGROUND ART

Conventionally, a substrate-to-substrate connector has been used to stack a plurality of substrates and connect respective wires of the substrates. In a case where the number of wires to be connected between substrates is large, a plurality of substrate-to-substrate connectors is used due to the insufficient number of pins included in one substrate-to-substrate connector, in some cases. However, when wires are connected using a plurality of substrate-to-substrate connectors, influences of misalignment between each connector and the substrates, and the like, are accumulated, and stress is likely to be applied to the connectors.

Then, a floating connector having a structure capable of absorbing the influences of misalignment described above has been conventionally proposed.

CITATION LIST

Patent Document

Patent Document 1: Japanese Patent Application Laid-Open No. H6-325825

SUMMARY OF THE INVENTION

Problems to be Solved by the Invention

However, the floating connector has a mounting area larger than that of a normal connector, and has also a larger height when fitted. The present disclosure has been made in view of such circumstances, and an object of the present disclosure is to provide a multilayer electronic substrate that is reduced in size and thickness while reducing stress applied to a connector.

Solutions to Problems

A multilayer electronic substrate according to one aspect of the present technology includes: a first substrate; a second substrate placed on the first substrate such that surfaces of the first and second substrates face each other; a first connector mounted on the surface of the first substrate and electrically connected to a first wire of the first substrate; a second connector mounted on the surface of the second substrate and electrically connected to a first wire of the second substrate, the second connector being directly connected to the first connector; and a wiring member having flexibility, the wiring member having one end electrically connected to a second wire of the first substrate and another end electrically connected to a second wire of the second substrate, to electrically connect the second wire of the first substrate and the second wire of the second substrate.

MODE FOR CARRYING OUT THE INVENTION

Hereinafter, preferred embodiments for carrying out the present technology will be described below with reference to the drawings. Note that the embodiments described below will show examples of representative embodiments of the present technology, and the scope of the present technology should not be narrowed by them.

Furthermore, in all the drawings for describing the embodiments of the present technology, components having the same functions are denoted by the same reference signs, and description thereof will be omitted.

Furthermore, each drawing is schematic, and components therein may be different from actual ones. Furthermore, the following embodiments show examples of a device and a method for embodying the technical idea of the present technology, and do not specifically determine the configuration as follows. That is, various alterations can be made to the technical idea of the present technology within the technical scope recited in the claims.

The description will be given in the following order.
1. First Embodiment
2. First modification of first embodiment
3. Second modification of first embodiment
4. Third modification of first embodiment
5. Second Embodiment First Embodiment <Configuration of Multilayer Wiring Substrate>

Figure 1:
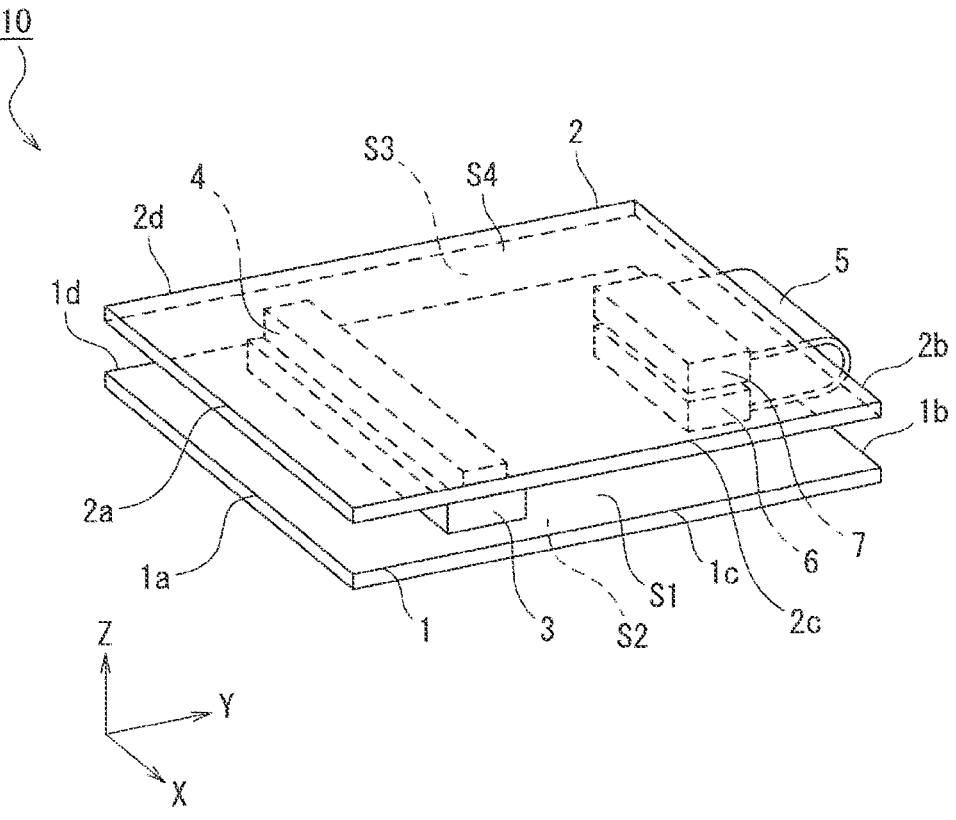
FIG. 1 is a perspective view illustrating a configuration example of a multilayer electronic substrate according to a first embodiment of the present technology.
Figure 2:
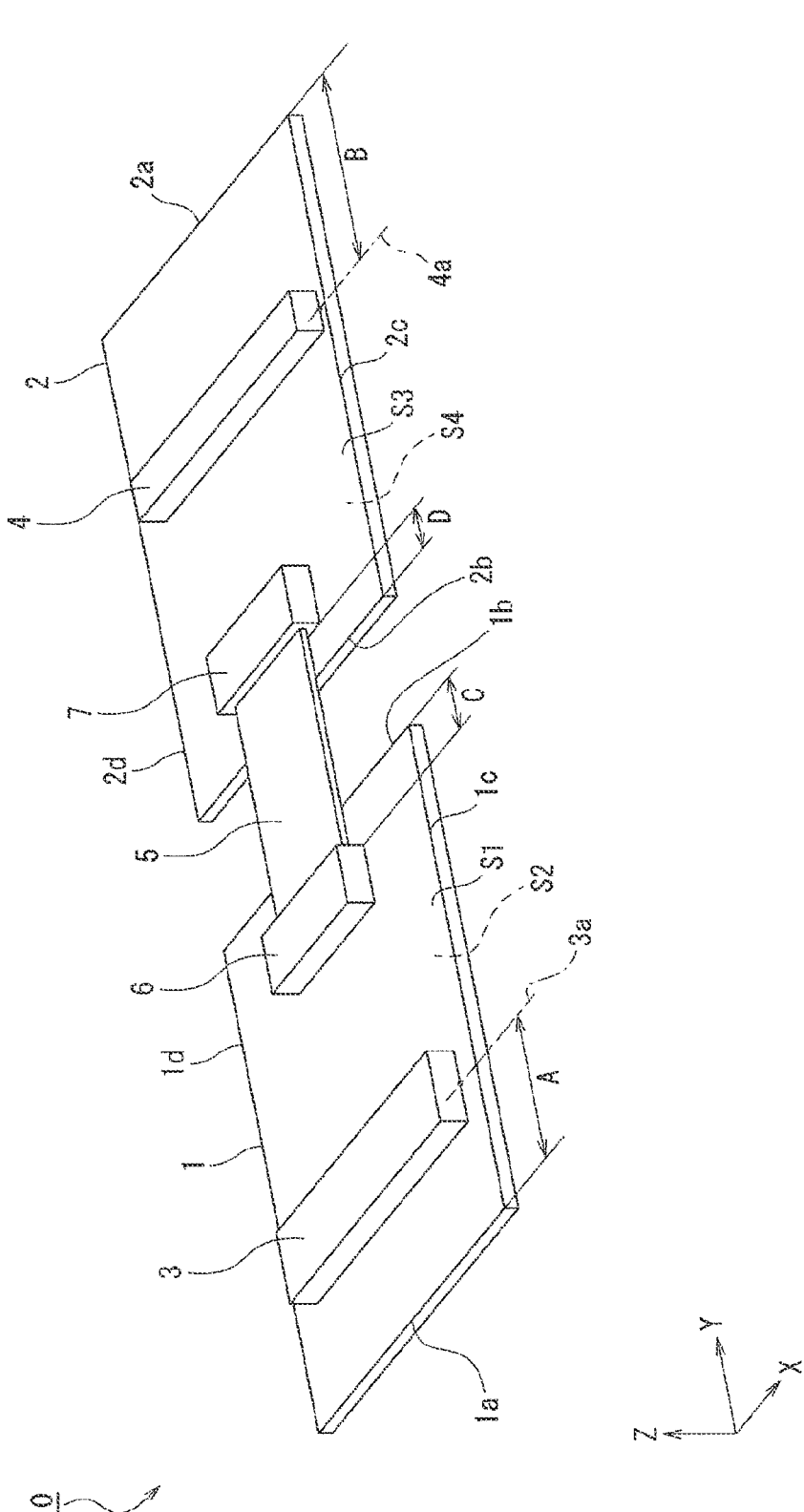
FIG. 2 is a developed view illustrating the configuration example of the multilayer electronic substrate according to the first embodiment of the present technology.
Figure 3:
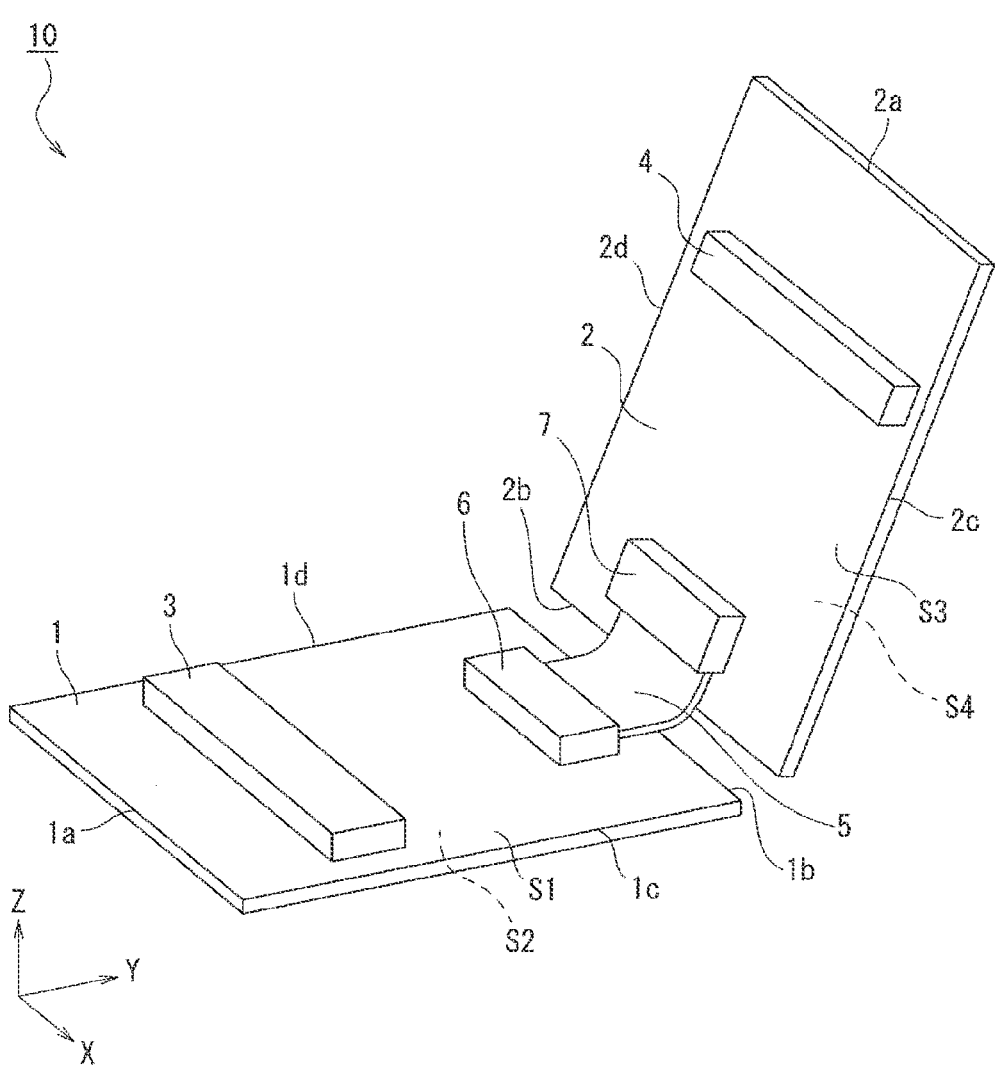
FIG. 3 is an assembly diagram of the multilayer electronic substrate according to the first embodiment of the present technology.

As illustrated in FIGS. 1, 2, and 3, a multilayer wiring substrate 10 according to a first embodiment of the present technology includes a first substrate 1, a second substrate 2, a first connector 3, a second connector 4, a wiring member 5, and third connectors 6 and 7.

The multilayer wiring substrate 10 is mounted on an electronic device, and is used, for example, to perform functions of the electronic device and control the electronic device.

The first substrate 1 is a rectangular printed board, and conductive wires are provided on a side where a front surface S1 is present (a side facing upward in FIG. 1) and a side where a back surface S2 is present (a side facing downward in FIG. 1) in a board including an insulator, and in the inside thereof. The wires connect electronic components mounted on the first substrate 1 and are connected to wires provided on the second substrate 2 described later. The first substrate 1 can be used as, for example, a general-purpose substrate. On the general-purpose substrate, a control circuit such as a CPU or a microcomputer is mounted, for example.

The second substrate 2 is a printed board having the same shape as the first substrate 1 described above, and conductive wires are provided on a side where a front surface S3 is present (a side facing downward in FIG. 1) and a side where a back surface S4 is present (a side facing upward in FIG. 1) in a board including an insulator, and in the inside thereof. The wires connect electronic components mounted on the second substrate 2 and are connected to the wires provided on the first substrate 1 described above. The second substrate 2 can be used as, for example, a dedicated substrate. On the dedicated substrate, electronic components for performing functions specific to the electronic device are mounted. For example, in a case where the electronic device is an imaging device such as a camera, a drive circuit for the imaging device and the like are mounted on the second substrate 2.

As illustrated in FIG. 1, the second substrate 2 is placed on the first substrate 1 such that the front surfaces S1 and S3 face each other. Specifically, the second substrate 2 is mounted on the first substrate 1, and the second substrate 2 and the first substrate 1 completely overlap each other along a thickness direction. As illustrated in FIG. 1, a widthwise direction of the first substrate 1 and the second substrate 2 is referred to as an X direction, a lengthwise direction of the first substrate 1 and the second substrate 2 is referred to as a Y direction, and a thickness direction of the first substrate 1 and the second substrate 2 is referred to as a Z direction. The X direction, the Y direction, and the Z direction are perpendicular to each other.

The first substrate 1 has an end 1a that is one Y-direction end, an end 1b that is the other Y-direction end, an end 1c that is one X-direction end, and an end 1d that is the other X-direction end. Furthermore, the second substrate 2 has an end 2a that is one Y-direction end, an end 2b that is the other Y-direction end, an end 2c that is one X-direction end, and an end 2d that is the other X-direction end.

As illustrated in FIG. 1, the end 1a of the first substrate 1 and the end 2a of the second substrate 2 overlap each other along the thickness direction. Furthermore, the end 1a and the end 2a form one Y-direction end of the multilayer wiring substrate 10.

As illustrated in FIG. 1, the end 1b of the first substrate 1 and the end 2b of the second substrate 2 overlap each other along the thickness direction. Furthermore, the end 1b and the end 2b form the other Y-direction end of the multilayer wiring substrate 10.

As illustrated in FIG. 1, the end 1c of the first substrate 1 and the end 2c of the second substrate 2 overlap each other along the thickness direction. Furthermore, the end 1c and the end 2c form one X-direction end of the multilayer wiring substrate 10.

As illustrated in FIG. 1, the end 1d of the first substrate 1 and the 2d of the second substrate 2 in the X-direction overlap each other along the thickness direction. Furthermore, the end 1d and the end 2d form the other X-direction end of the multilayer wiring substrate 10.

The first connector 3 and the second connector 4 form a pair of substrate-to-substrate connectors. The first connector 3 is a connector receptacle, and the second connector 4 is a connector plug.

A terminal of the first connector 3 is connected to a wire (not illustrated) of the first substrate 1 on which the first connector 3 is mounted. Here, the above-described wire connected to the terminal of the first connector 3 is referred to as a first wire in order to be distinguished from the other wires of the first substrate 1. Furthermore, a terminal of the second connector 4 is connected to a wire (not illustrated) of the second substrate 2 on which the second connector 4 is mounted. Here, the above-described wire connected to the terminal of the second connector 4 is referred to as a first wire in order to be distinguished from the other wires of the second substrate 2. Then, when the first connector 3 and the second connector 4 are directly connected to each other, the respective terminals come into contact with each other, and the first wire of the first substrate 1 and the first wire of the second substrate 2 are electrically connected to each other.

The first connector 3 includes a plurality of terminals each formed as described above. The terminals in the plurality of terminals of the first connector 3 are arranged with a first pitch. Here, a direction in which the terminals are arranged is referred to as a pitch direction. The first connector 3 may have two or more rows each of which includes the plurality of terminals arranged with the first pitch and extends along a direction perpendicular to the pitch direction. In such a case, the direction perpendicular to the pitch direction is referred to as a row direction. Furthermore, a direction perpendicular to both the pitch direction and the row direction of the first connector 3 is referred to as a height direction. The height direction corresponds to a direction in which the first connector 3 and the second connector 4 are connected.

The first connector 3 has a shape elongated along the pitch direction. The first connector 3 is mounted on the front surface S1 of the first substrate 1. In the first connector 3 mounted on the first substrate 1, the pitch direction is parallel to the X direction, the row direction is parallel to the Y direction, and the height direction is parallel to the Z direction.

The second connector 4 includes a plurality of terminals each formed as described above. The terminals in the plurality of terminals of the second connector 4 are arranged with the first pitch. Here, a direction in which the terminals are arranged is referred to as a pitch direction. The second connector 4 may have two or more rows each of which includes the plurality of terminals arranged with the first pitch and extends along a direction perpendicular to the pitch direction. In such a case, the direction perpendicular to the pitch direction is referred to as a row direction. Furthermore, a direction perpendicular to both the pitch direction and the row direction of the second connector 4 is referred to as a height direction. The height direction corresponds to a direction in which the first connector 3 and the second connector 4 are connected.

The second connector 4 has a shape elongated along the pitch direction. The second connector 4 is mounted on the front surface S3 of the second substrate 2. In the second connector 4 mounted on the second substrate 2, the pitch direction is parallel to the X direction, the row direction is parallel to the Y direction, and the height direction is parallel to the Z direction.

As illustrated in FIG. 1, the first connector 3 and the second connector 4 are directly connected to each other along the Z direction, to electrically connect the first wire of the first substrate 1 and the first wire of the second substrate 2. Here, the terms "directly connected" mean that, for example, the respective terminals come into contact and are electrically connected to each other by insertion of one of the first connector 3 and the second connector 4 into the other, fitting of the one and the other into each other, or the like.

In order to enable the direct connection described above, the first connector 3 mounted on the first substrate 1 and the second connector 4 mounted on the second substrate 2 are provided at positions where they overlap each other along the Z direction when the first substrate 1 and the second substrate 2 are stacked on each other. Specifically, as illustrated in FIG. 1, the first connector 3 and the second connector 4 are provided nearer to the one Y-direction end of the multilayer wiring substrate 10. As illustrated in FIG. 1, the pitch direction, the row direction, and the height direction of the first connector 3 are parallel to the pitch direction, the row direction, and the height direction of the second connector 4, respectively. Then, as illustrated in FIG. 2 illustrating a state in which the first substrate 1 and the second substrate 2 are separated and the second substrate 2 is unfolded, a distance A from the end 1a that is the one Y-direction end of the first substrate 1 to a center line 3a that passes through the Y-direction center of the first connector 3 and is parallel to the X direction is equal to a distance B from the end 2a that is the one Y-direction end of the second substrate 2 to a center line 4a that passes through the Y-direction center of the second connector 4 and is parallel to the X direction.

The first connector 3 and the second connector 4 forming the substrate-to-substrate connectors, are used, for example, to connect wires (high-speed signal lines) that require transmission and reception of signals at a relatively high speed among the wires of the first substrate 1 and the second substrate 2.

The wiring member 5 is, for example, a flexible flat cable (FFC) or a flexible printed circuit (FPC). The wiring member 5 has flexibility, and hence can be bent. The wiring member 5 has one end electrically connected to the wire of the first substrate 1, and has the other end electrically connected to the wire of the second substrate 2. Thus, the wiring member electrically connects the wire of the first substrate 1 and the wire of the second substrate 2.

The wiring member 5 includes a plurality of wires in the inside thereof, and one end of each wire is connected to a terminal of the third connector 6 mounted on the first substrate 1. The terminal of the third connector 6 connected to the one ends of the wires of the wiring member 5 are connected to a wire (not illustrated) of the first substrate 1 on which the third connector 6 is mounted. Here, the above-described wire connected to the terminal of the third connector 6 is referred to as a second wire in order to be distinguished from the other wires and, in particular, from the above-described first wire, of the first substrate 1. In this manner, the wires of the wiring member 5 are electrically connected to the second wire of the first substrate 1.

Furthermore, the other end of each wire of the wiring member 5 is connected to a terminal of the third connector 7 mounted on the second substrate 2. The terminal of the third connector 7 connected to the other ends of the wires of the wiring member 5 are connected to a wire (not illustrated) of the second substrate 2 on which the third connector 7 is mounted. Here, the above-described wire connected to the terminal of the third connector 7 is referred to as a second wire in order to be distinguished from the other wires and, in particular, from the above-described first wire, of the second substrate 2. In this manner, the wires of the wiring member 5 are electrically connected to the second wire of the second substrate 2.

Therefore, the second wire of the first substrate 1 and the second wire of the second substrate 2 are electrically connected via the wires of the wiring member 5. Specifically, the second wire of the first substrate 1 and the second wire of the second substrate 2 are electrically connected via the third connector 6, the wires of the wiring member 5, and the third connector 7.

The wires of the wiring member 5 are formed integrally with each other in a state in which one ends thereof are arranged in a row, the other ends thereof are arranged in a row, and the wires are insulated from each other. Furthermore, a direction in which the wires of the wiring member 5 extend is referred to as a lengthwise direction, and a direction in which the one ends or the other ends of the wires are arranged is referred to as a widthwise direction. Meanwhile, the widthwise direction is a direction perpendicular to the lengthwise direction.

The third connector 6 includes a plurality of terminals each formed as described above. The third connector 6 includes a plurality of terminals arranged with a second pitch. A direction in which the terminals are arranged is referred to as a pitch direction. The third connector 6 has a shape elongated along the pitch direction. Then, the one end of the wiring member 5 is inserted into the third connector 6 along a direction perpendicular to the pitch direction. The direction perpendicular to the pitch direction is a direction in which the wiring member 5 is inserted and is referred to as an insertion direction. Furthermore, a direction perpendicular to both the pitch direction and the insertion direction of the third connector 6 is referred to as a height direction.

The third connector 6 is mounted on the front surface S1 of the first substrate 1. In the third connector 6 mounted on the first substrate 1, the pitch direction is parallel to the X direction, the insertion direction is parallel to the Y direction, and the height direction is parallel to the Z direction.

When the one end of the wiring member 5 is inserted into the third connector 6, the terminal of the third connector 6 and the one ends of the wires of the wiring member 5 come into contact with each other and are electrically connected. The widthwise direction of the one end of the wiring member 5 inserted into the third connector 6 is parallel to the pitch direction of the third connector 6. Furthermore, the third connector 6 includes a lock mechanism (not illustrated) for preventing the inserted one end of the wiring member 5 from coming off.

The third connector 7 includes a plurality of terminals each formed as described above. The third connector 7 includes a plurality of terminals arranged with the second pitch. A direction in which the terminals are arranged is referred to as a pitch direction. The third connector 7 has a shape elongated along the pitch direction. Then, the other end of the wiring member 5 is inserted into the third connector 7 along a direction perpendicular to the pitch direction. The direction perpendicular to the pitch direction is a direction in which the wiring member 5 is inserted and is referred to as an insertion direction. Furthermore, a direction perpendicular to both the pitch direction and the insertion direction of the third connector 7 is referred to as a height direction.

The third connector 7 is mounted on the front surface S3 of the second substrate 2. In the third connector 7 mounted on the second substrate 2, the pitch direction is parallel to the X direction, the insertion direction is parallel to the Y direction, and the height direction is parallel to the Z direction.

When the other end of the wiring member 5 is inserted into the third connector 7, the terminal of the third connector 7 and the other ends of the wires of the wiring member 5 come into contact with each other and are electrically connected. The widthwise direction of the other end of the wiring member 5 inserted into the third connector 7 is parallel to the pitch direction of the third connector 7. Furthermore, the third connector 7 includes a lock mechanism (not illustrated) for preventing the inserted other end of the wiring member 5 from coming off.

Furthermore, in the wiring member 5 connected to the third connector 6 mounted on the first substrate 1 and the third connector 7 mounted on the second substrate 2, the lengthwise direction is parallel to the Y direction, and the widthwise direction is parallel to the X direction.

The third connector 6 and the third connector 7 are connected via the wiring member 5 having flexibility. Thus, the third connector 6 and the third connector 7 can move relative to each other even in a state where the third connector 6 and the third connector 7 are electrically connected via the wiring member 5 having flexibility as described above. The third connector 6 and the third connector 7 can greatly move relative to each other along the Y direction because the lengthwise direction of the wiring member 5 is parallel to the Y direction. Furthermore, the third connector 6 and the third connector 7 can move relative to each other also along the X direction within a certain range. Moreover, the third connector 6 and the third connector 7 can rotate relative to each other around a rotation axis extending along the Z direction within a certain range. In addition, the third connector 6 and the third connector 7 can move relative to each other also along the Z direction within a certain range. The stress generated in the wiring member 5 by such relative movement of the third connector 6 and the third connector 7 is sufficiently small because the wiring member 5 has flexibility.

As illustrated in FIG. 1, the pitch direction of the terminals of the third connectors 6 and 7 is parallel to the X direction, and also the pitch direction of the terminals of the first connector 3 and the second connector 4 is parallel to the X direction. Thus, the pitch direction of the terminals of the third connectors 6 and 7 is parallel to the pitch direction of the terminals of the first connector 3 and the second connector 4. Furthermore, also the widthwise direction of the wiring member 5 connected to the third connectors 6 and 7 is parallel to the pitch direction of the terminals of the first connector 3 and the second connector 4.

Furthermore, as illustrated in FIG. 1, the third connector 6 mounted on the first substrate 1 and the third connector 7 mounted on the second substrate 2 are placed at positions where they overlap each other along the Z direction. Specifically, as illustrated in FIG. 1, the third connector 6 and the third connector 7 are provided nearer to the other Y-direction end of the multilayer wiring substrate 10. As illustrated in FIG. 1, the pitch direction, the insertion direction, and the height direction of the third connector 6 are parallel to the pitch direction, the insertion direction, and the height direction of the third connector 7, respectively. Then, as illustrated in FIG. 2 illustrating a state in which the first substrate 1 and the second substrate 2 are separated and the second substrate 2 is unfolded, a distance C from the end 1b that is the other Y-direction end of the first substrate 1 to the third connector 6 is equal to a distance D from the end 2b that is the other Y-direction end of the second substrate 2 to the third connector 7.

Furthermore, whereas the first connector 3 and the second connector 4 described above are used, for example, to connect high-speed signal lines of the first substrate 1 and the second substrate 2, the third connector 6, the third connector 7, and the wiring member 5 are used to connect, for example, other signal lines because of less suitability thereof for transmission of high-speed signals than the substrate-to-substrate connectors.

<Method for Assembling Multilayer Wiring Substrate>

The multilayer wiring substrate 10 described above is assembled as follows. First, the first substrate 1 and the second substrate 2 on which electronic components have been mounted are prepared. Secondly, the first connector 3 and the third connector 6 are mounted on the first substrate 1, and the second connector 4 and the third connector 7 are mounted on the second substrate 2. Moreover, as illustrated in FIG. 2, the one end of the wiring member 5 is inserted into the third connector 6, and the other end of the wiring member 5 is inserted into the third connector 7. At that time, the lock mechanism is operated to prevent the wiring member 5 inserted into the third connectors 6 and 7 from coming off.

Then, as illustrated in FIG. 3, the wiring member 5 is bent, bringing the front surface S1 of the first substrate 1 and the front surface S3 of the second substrate 2 close to each other. Finally, as illustrated in FIG. 1, the first connector 3 and the second connector 4 are directly connected. The foregoing description is description about the multilayer wiring substrate 10 according to the first embodiment of the present technology.

<Effects>

In a case where the number of wires to be connected between the first substrate 1 and the second substrate 2 is large, a plurality of pairs of connectors for connecting the wires is required. However, to use a plurality of pairs of connectors causes misalignment or rotation due to an error in an outer shape of the connectors and an error in mounting. Hence, the connectors cannot be connected, or large stress is applied to the connected connectors in some cases. Thus, a floating connector is sometimes used, but the floating connector has a larger mounting area and a larger height along the thickness direction than those of a normal connector.

In the multilayer electronic substrate according to the first embodiment, the first wires are electrically connected to each other by the first connector 3 and the second connector 4, and the second wires are electrically connected to each other by the wiring member 5 having flexibility and the third connectors 6 and 7.

Consequently, even in a case where the number of wires to be connected between the first substrate 1 and the second substrate 2 is large and exceeds the number of terminals of the first connector 3 and the second connector 4, the wires in number corresponding to the excess, in other words, the wires that fail to be connected only with the first connector 3 and the second connector 4, can be connected by using the wiring member 5 having flexibility and the third connectors 6 and 7.

Furthermore, the third connector 6 and the third connector 7 are connected via the wiring member 5 having flexibility. Thus, the third connector 6 and the third connector 7 can move relative to each other. Therefore, despite misalignment or rotation due to an error in an outer shape of the connectors or an error in mounting, the connectors can be reliably connected.

Furthermore, the stress generated in the wiring member 5 due to relative movement of the third connector 6 and the third connector 7 is sufficiently small because the wiring member 5 has flexibility.

Furthermore, there is no need to use a floating connector in the multilayer electronic substrate according to the first embodiment, and hence the size and thickness of the multilayer electronic substrate can be reduced. For example, the area of the multilayer electronic substrate can be reduced by 40%, and the thickness can be reduced by 70%.

Furthermore, in the multilayer electronic substrate according to the first embodiment, the wires are connected via the substrate-to-substrate connectors and the wiring member 5 having flexibility, and hence the widths of the third connector 6 and the third connector 7 can be prevented from increasing, as compared with a case where wires are connected only via the wiring member 5 having flexibility. Moreover, it is possible to prevent the pitch of the terminals of the third connector 6 and the third connector 7 from being narrowed. With a narrowed pitch, there may possibly occur a case in which high current cannot flow.

Furthermore, in the multilayer electronic substrate according to the first embodiment, the first substrate 1 is used as a general-purpose substrate, and the second substrate 2 is used as a dedicated substrate, so that those substrates can be separately developed or manufactured on separate lines. Also in the substrates developed separately or manufactured on different lines, the third connector 6 and the third connector 7 can move relative to each other. Therefore, despite misalignment or rotation due to an error in an outer shape of the connectors or an error in mounting, the connectors can be reliably connected.

Note that, in the case of a configuration in which the first substrate 1 is used as a general-purpose substrate on which a CPU is mounted and the second substrate 2 is used as a dedicated substrate, signal lines to be used frequently may be allocated to the first connector 3 and the second connector 4 forming the substrate-to-substrate connectors, and signal lines to be used less frequently or signal lines for debugging may be allocated to connection via the wiring member 5. Thus, by preferential allocation of frequently-used signal lines or wires (high-speed signal lines) that require transmission and reception of signals at a relatively high speed, to the substrate-to-substrate connectors, implementation is possible only with the substrate-to-substrate connectors, depending on the type of the dedicated substrate.

Furthermore, the outer shape of the first substrate 1 may be different from the outer shape of the second substrate 2. Moreover, the distance A and the distance B illustrated in FIG. 2 may be different as long as the first connector 3 and the second connector 4 can be directly connected.

Furthermore, the pitch direction of the terminals of the third connectors 6 and 7 is parallel to the pitch direction of the terminals of the first connector 3 and the second connector 4, but the configuration is not limited thereto. The pitch direction of the terminals of the third connectors 6 and 7 may be inclined at a randomly-selected angle with respect to the pitch direction of the terminals of the first connector 3 and the second connector 4.

First Modification of First Embodiment

<Configuration of Multilayer Wiring Substrate>

Figure 4:
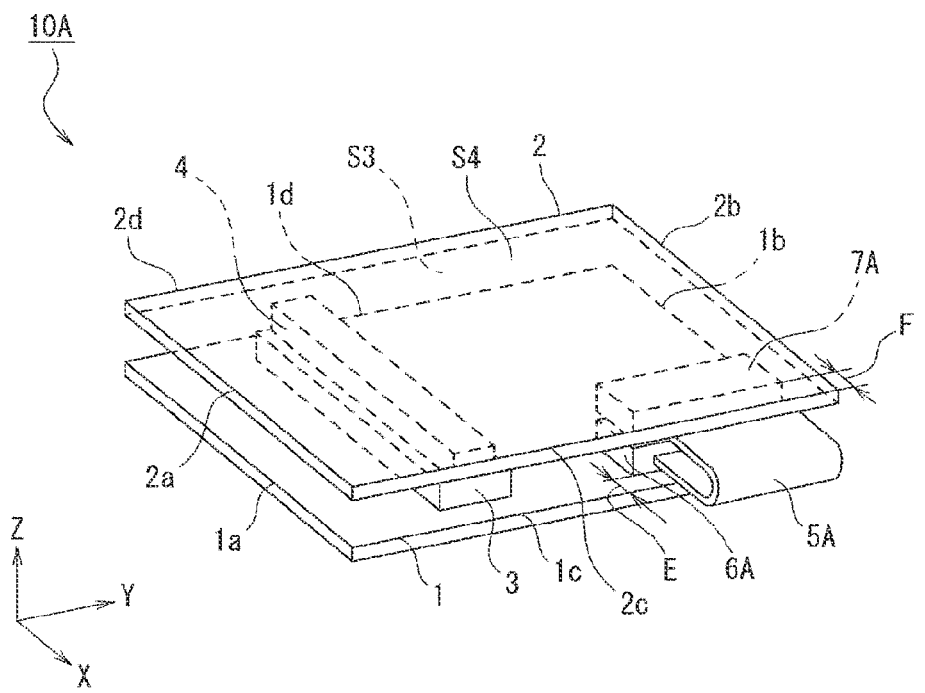
FIG. 4 is a perspective view illustrating a configuration example of a multilayer electronic substrate according to a first modification of the first embodiment of the present technology.

A first modification of the first embodiment of the present technology illustrated in FIG. 4 will be described below. A multilayer wiring substrate 10A according to the first modification of the first embodiment is different from the multilayer wiring substrate 10 according to the first embodiment described above in that third connectors 6A and 7A and a wiring member 5A are provided instead of the third connectors 6 and 7, and the configuration of the multilayer wiring substrate 10A is basically similar to the configuration of the multilayer wiring substrate 10 according to the first embodiment described above in other respects.

The respective configurations of the third connectors 6A and 7A and the wiring member 5A of the first modification of the first embodiment are the same as the respective configurations of the third connectors 6 and 7 and the wiring member 5 of the first embodiment described above, but positions where they are provided are different from those in the first embodiment. In the first embodiment, the third connectors 6 and 7 and the wiring member 5 are provided nearer to the other Y-direction end of the multilayer wiring substrate 10. In contrast, in the first modification of the first embodiment, the third connectors 6A and 7A and the wiring member 5A are provided nearer to the one X-direction end of the multilayer wiring substrate 10A.

The third connector 6A is provided nearer to the one X-direction end of the first substrate 1, that is, nearer to the end 1c. As illustrated in FIG. 4, the pitch direction is parallel to the Y direction, the insertion direction is parallel to the X direction, and the height direction is parallel to the Z direction. Moreover, the third connector 7A is provided nearer to the one X-direction end of the second substrate 2, that is, nearer to the end 2c, the pitch direction is parallel to the Y direction, the insertion direction is parallel to the X direction, and the height direction is parallel to the Z direction.

As described above, whereas the pitch direction of the terminals of the third connectors 6A and 7A is parallel to the Y direction, the pitch direction of the terminals of the first connector 3 and the second connector 4 is parallel to the X direction. Thus, the pitch direction of the terminals of the third connectors 6A and 7A is perpendicular to the pitch direction of the terminals of the first connector 3 and the second connector 4. Furthermore, also the widthwise direction of the wiring member 5A connected to the third connectors 6A and 7A is perpendicular to the pitch direction of the terminals of the first connector 3 and the second connector 4.

Furthermore, the third connector 6A mounted on the first substrate 1 and the third connector 7A mounted on the second substrate 2 are placed at positions where they overlap each other along the Z direction. Specifically, the third connector 6A and the third connector 7A are provided nearer to the one X-direction end of the multilayer wiring substrate 10A. The pitch direction, the insertion direction, and the height direction of the third connector 6A are parallel to the pitch direction, the insertion direction, and the height direction of the third connector 7A, respectively. Then, a distance E from the end 1c that is the one X-direction end of the first substrate 1 to the third connector 6A is equal to a distance F from the end 2c that is the one X-direction end of the second substrate 2 to the third connector 7A.

Furthermore, in the above-described wiring member 5A connected to the third connectors 6A and 7A, the lengthwise direction is parallel to the X direction, and the widthwise direction is parallel to the Y direction.

The third connector 6A and the third connector 7A are connected via the wiring member 5A having flexibility. Thus, the third connector 6A and the third connector 7A can move relative to each other even in a state in which the third connector 6A and the third connector 7A are electrically connected via the wiring member 5A having flexibility as described above. The third connector 6A and the third connector 7A can greatly move relative to each other along the X direction because the lengthwise direction of the wiring member 5A is parallel to the X direction. Furthermore, the third connector 6A and the third connector 7A can move relative to each other also along the Y direction within a certain range. Moreover, the third connector 6A and the third connector 7A can rotate relative to each other around a rotation axis extending along the Z direction within a certain range. In addition, the third connector 6A and the third connector 7A can move relative to each other also along the Z direction within a certain range. The stress generated in the wiring member 5A by such relative movement of the third connector 6A and the third connector 7A is sufficiently small because the wiring member 5A has flexibility.

<Effects>

Also the multilayer wiring substrate 10A according to the first modification of the first embodiment produces effects similar to those produced by the multilayer wiring substrate 10 according to the first embodiment described above.

Note that the third connector 6A is provided nearer to the one X-direction end of the first substrate 1, that is, nearer to the end 1c, but the third connector 6A may be provided nearer to the other X-direction end, that is, nearer to the end 1d. Furthermore, the third connector 7A is provided nearer to the one X-direction end of the second substrate 2, that is, nearer to the end 2c, but the third connector 7A may be provided nearer to the other X-direction end, that is, nearer to the end 2d.

Furthermore, the pitch direction of the terminals of the third connectors 6A and 7A is perpendicular to the pitch direction of the terminals of the first connector 3 and the second connector 4, but the angle between the pitch directions is not limited thereto and may be an angle smaller than a right angle.

Figure 5:
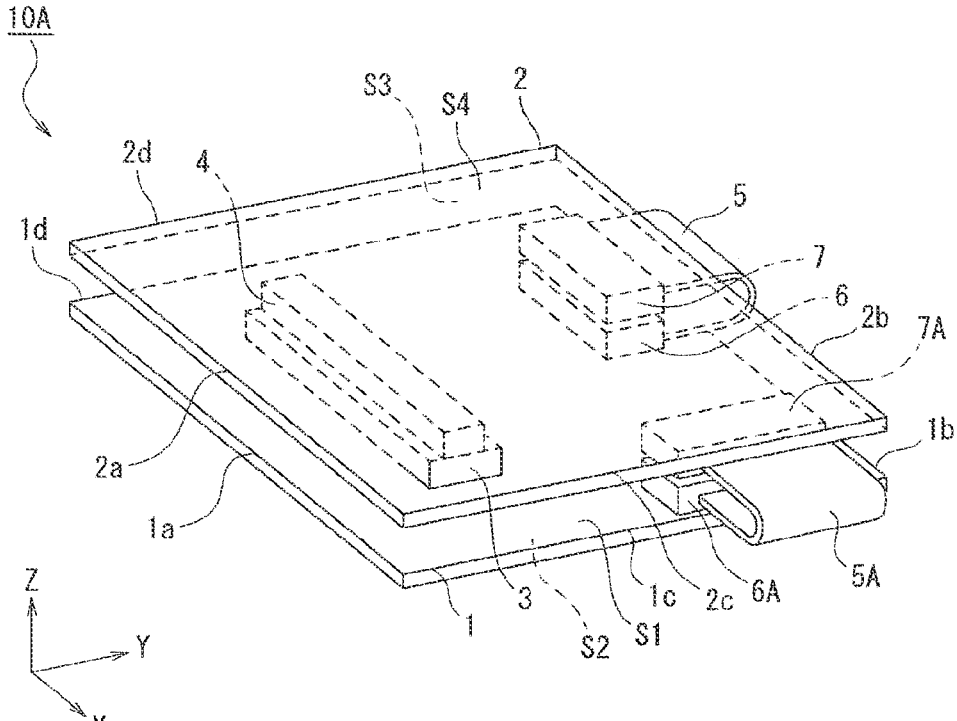
FIG. 5 is a perspective view illustrating a configuration example of a multilayer electronic substrate according to a combination of the first embodiment of the present technology and the first modification of the first embodiment of the present technology.

Furthermore, as illustrated in FIG. 5, the multilayer wiring substrate 10A may include the third connectors 6 and 7 and the wiring member 5 (first wiring member) of the first embodiment described above, in addition to the third connectors 6A and 7A and the wiring member 5A (second wiring member) of the first modification of the first embodiment. In such a case, at least a part of the connection of the wiring member 5A to the third connectors 6A and 7A and the connection of the wiring member 5 to the third connectors 6 and 7 may be made after the first connector 3 and the second connector 4 are connected. For example, the wiring member 5A is connected to the third connector 7A after the first connector 3 and the second connector 4 are connected. The lock mechanism of the third connector 7A may be of a type that can be operated after the first connector 3 and the second connector 4 are connected, or the position of the third connector 7A or the like may be modified so that the lock mechanism of the third connector 7A can be operated after the first connector 3 and the second connector 4 are connected. Furthermore, in a case where the third connector 7A does not include the lock mechanism, it is only required that the wiring member 5A is inserted into the third connector 7A. In this case, the third connector 6 and the third connector 7 are connected by the wiring member 5, and the one end of the wiring member 5A is connected to the third connector 6A. Subsequently, in this state, the first connector 3 and the second connector 4 are connected. Then, the other end of the wiring member 5A of which one end is connected to the third connector 6 is inserted into the third connector 7A that does not include the lock mechanism, to make connection. At that time, the lengthwise direction of the wiring member 5A is perpendicular to the lengthwise direction of the wiring member 5.

Second Modification of First Embodiment

<Configuration of Multilayer Wiring Substrate>

Figure 6:
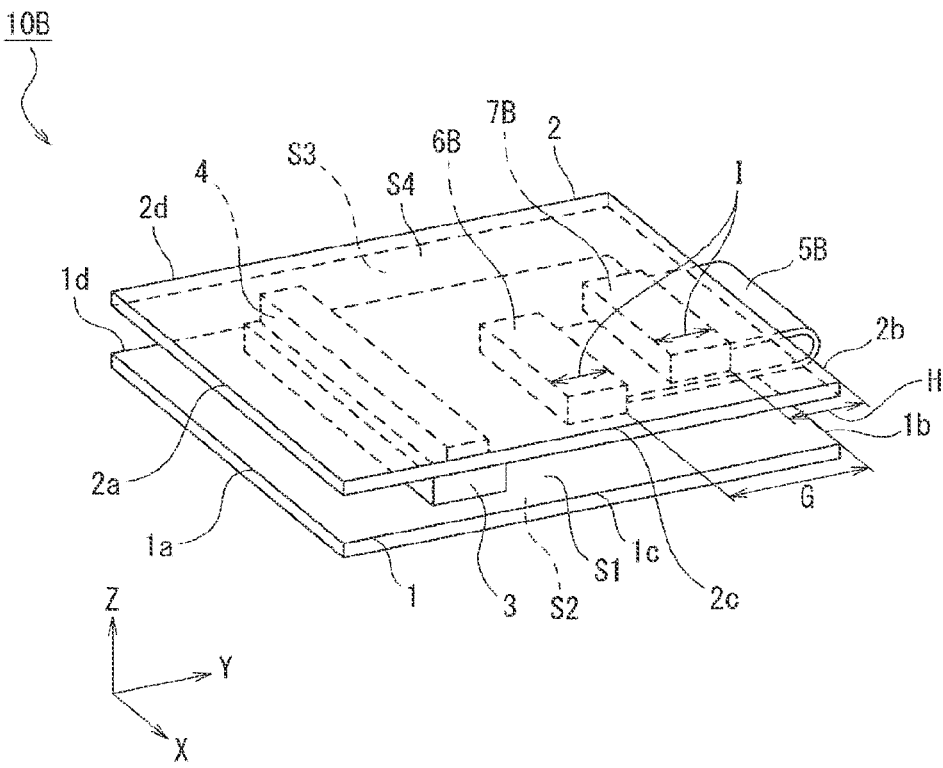
FIG. 6 is a perspective view illustrating a configuration example of a multilayer electronic substrate according to a second modification of the first embodiment of the present technology.

With reference to FIG. 6, a second modification of the first embodiment of the present technology will be described below. A multilayer wiring substrate 10B according to the second modification of the first embodiment is different from the multilayer wiring substrate 10 according to the first embodiment described above in that third connectors 6B and 7B and a wiring member 5B are provided instead of the third connectors 6 and 7 and the wiring member 5, and the configuration of the multilayer wiring substrate 10B is basically similar to the configuration of the multilayer wiring substrate 10 according to the first embodiment described above in other respects.

The respective configurations of the third connectors 6B and 7B and the wiring member 5B of the second modification of the first embodiment are the same as the respective configurations of the third connectors 6 and 7 and the wiring member 5 of the first embodiment described above, but positions where they are provided are different from those in the first embodiment. In the first embodiment, the third connector 6 mounted on the first substrate 1 and the third connector 7 mounted on the second substrate 2 are provided at positions where they overlap each other along the Z direction. In contrast, in the second modification of the first embodiment, the third connector 6B mounted on the first substrate 1 and the third connector 7B mounted on the second substrate 2 are provided at positions where they do not overlap each other along the Z direction.

The third connector 6B is provided nearer to the other Y-direction end of the first substrate 1, that is, nearer to the end 1b, the pitch direction is parallel to the X direction, the insertion direction is parallel to the Y direction, and the height direction is parallel to the Z direction. Moreover, the third connector 7B is provided nearer to the other Y-direction end of the second substrate 2, that is, nearer to the end 2b, the pitch direction is parallel to the X direction, the insertion direction is parallel to the Y direction, and the height direction is parallel to the Z direction.

The third connector 6B and the third connector 7B described above are provided at positions where they do not overlap each other along the Z direction. The pitch direction, the insertion direction, and the height direction of the third connector 6B are parallel to the pitch direction, the insertion direction, and the height direction of the third connector 7B, respectively. A distance G from the end 1b that is the other Y-direction end of the first substrate 1 to the third connector 6B is larger than a distance H from the end 2b that is the other Y-direction end of the second substrate 2 to the third connector 7B (G>H). Here, the dimension of the third connector 6B or 7B along the insertion direction is a width I. Thus, when the distance G is equal to or larger than a sum of the distance H and the width I (G≥H+I), the third connector 6B and the third connector 7B do not overlap each other along the Z direction.

Furthermore, in the above-described wiring member 5B connected to the third connectors 6B and 7B, the lengthwise direction is parallel to the Y direction, and the widthwise direction is parallel to the X direction. The length of the wiring member 5B along the lengthwise direction is only required to be appropriately determined in accordance with the distance G, the distance H, and the width I described above.

<Effects>

Also the multilayer wiring substrate 10B according to the second modification of the first embodiment produces effects similar to those produced by the multilayer wiring substrate 10 according to the first embodiment described above.

Furthermore, in the multilayer wiring substrate 10B according to the first modification of the first embodiment, the third connector 6B mounted on the first substrate 1 and the third connector 7B mounted on the second substrate 2 are provided at positions where they do not overlap each other along the Z direction. Thus, the dimension of the multilayer wiring substrate 10B along the Z direction can be reduced as compared with the case where the third connectors 6B and 7B overlap. Thus, an interval between the second substrate 2 and the first substrate 1 in the case where the third connectors 6B and 7B do not overlap is narrower than that in the case where the third connectors 6B and 7B overlap. Therefore, the thickness can be further reduced.

For example, consider a case where the height of the first connector 3 and the height of the second connector 4 along the Z direction at the time of connection are reduced. When the height of the first connector 3 and the height of the second connector 4 along the Z direction at the time of connection are smaller than the height of a stack of the third connector 6B and the third connector 7B along the Z direction, the maximum interval between the second substrate 2 and the first substrate 1 is equal to the height of a stack of the third connector 6B and the third connector 7B. Meanwhile, when the third connector 6B and the third connector 7B do not overlap each other, the larger one of the heights of the first connector 3 and the second connector 4 at the time of connection and the height of the third connector 6B or the third connector 7B is the maximum interval between the second substrate 2 and the first substrate 1. In this manner, the thickness can be further reduced.

Note that, in FIG. 6, the distance G from the end 1b of the first substrate 1 to the third connector 6B is larger than the distance H from the end 2b of the second substrate 2 to the third connector 7B (G>H), but the distance H from the end 2b of the second substrate 2 to the third connector 7B may be larger than the distance G from the end 1b of the first substrate 1 to the third connector 6B (H>G).

Furthermore, in FIG. 6, the distance G from the end 1b of the first substrate 1 to the third connector 6B is equal to or larger than the sum of the distance H from the end 2b of the second substrate 2 to the third connector 7B and the width I (G≥H+I), but the distance H from the end 2b of the second substrate 2 to the third connector 7B may be equal to or larger than a sum of the distance G from the end 1b of the first substrate 1 to the third connector 6B and the width I (H≥G+I).

Furthermore, the second modification of the first embodiment may be applied to the first modification of the first embodiment described above.

Third Modification of First Embodiment

<Configuration of Multilayer Wiring Substrate>

Figure 7:
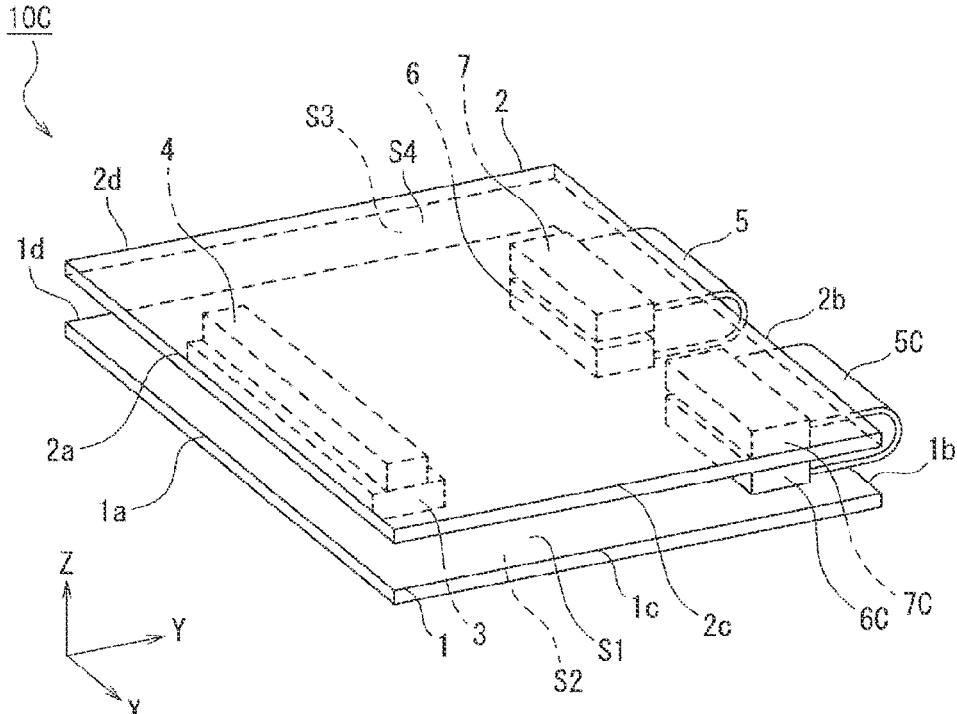
FIG. 7 is a perspective view illustrating a configuration example of a multilayer electronic substrate according to a third modification of the first embodiment of the present technology.

A third modification of the first embodiment of the present technology illustrated in FIG. 7 will be described below. A multilayer wiring substrate 10C according to the third modification of the first embodiment is different from the multilayer wiring substrate 10 according to the first embodiment described above in that third connectors 6C and 7C and a wiring member 5C (second wiring member) are provided in addition to the third connectors 6 and 7 and the wiring member 5 (first wiring member), and the configuration of the multilayer wiring substrate 100 is basically similar to the configuration of the multilayer wiring substrate 10 according to the first embodiment described above in other respects.

The respective configurations of the third connectors 6C and 7C and the wiring member 5C of the third modification of the first embodiment are the same as the respective configurations of the third connectors 6 and 7 and the wiring member 5.

The third connector 6C is provided nearer to the other Y-direction end of the first substrate 1, that is, nearer to the end 1b, the pitch direction is parallel to the X direction, the insertion direction is parallel to the Y direction, and the height direction is parallel to the Z direction. Moreover, the third connector 7C is provided nearer to the other Y-direction end of the second substrate 2, that is, nearer to the end 2b, the pitch direction is parallel to the X direction, the insertion direction is parallel to the Y direction, and the height direction is parallel to the Z direction.

Furthermore, in above-described the wiring member 5C connected to the third connectors 6C and 7C, the lengthwise direction is parallel to the Y direction, and the widthwise direction is parallel to the X direction.

The third connectors 6 and 7 and the third connectors 6C and 7C are provided side by side along the X direction. Then, the wiring member 5 and the wiring member 5C are provided side by side along the X direction. In other words, the lengthwise direction of the wiring member 5C is parallel to the lengthwise direction of the wiring member 5.

<Effects>

Also the multilayer wiring substrate 100 according to the third modification of the first embodiment produces effects similar to those produced by the multilayer wiring substrate 10 according to the first embodiment described above.

Furthermore, the multilayer wiring substrate 100 according to the third modification of the first embodiment can flexibly cope with an increase in the number of wires to be connected between the first substrate 1 and the second substrate 2.

Furthermore, the third modification of the first embodiment may be applied to the first modification and the second modification of the first embodiment described above.

Second Embodiment

<Configuration of Multilayer Wiring Substrate>

Figure 8:
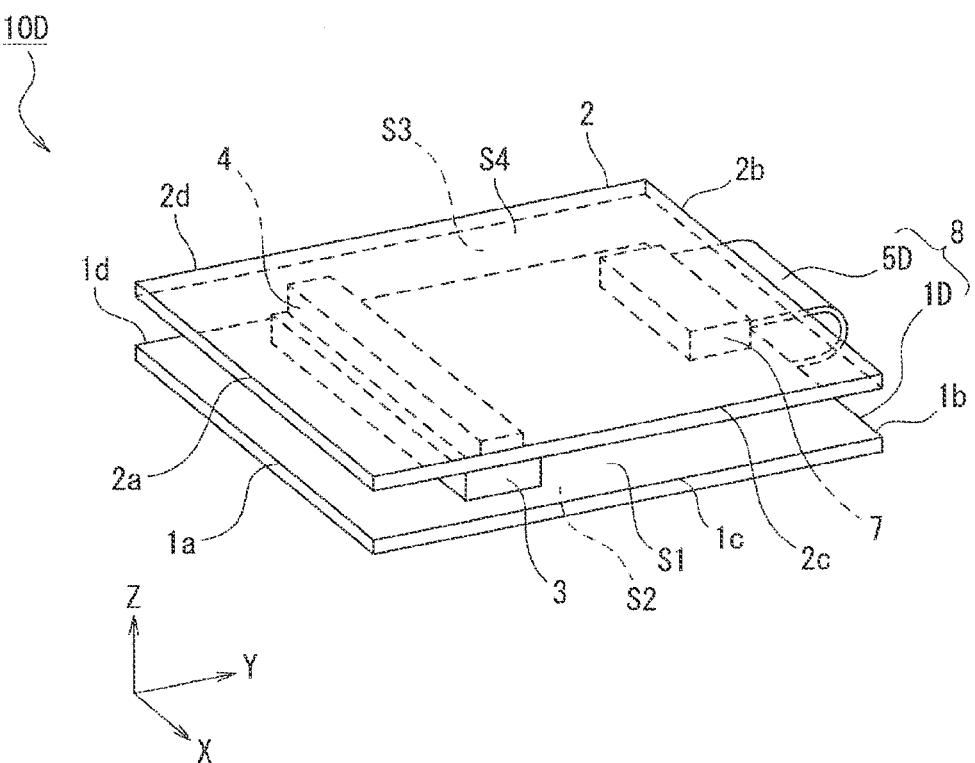
FIG. 8 is a perspective view illustrating a configuration example of a multilayer electronic substrate according to a second embodiment of the present technology.
Figure 9:
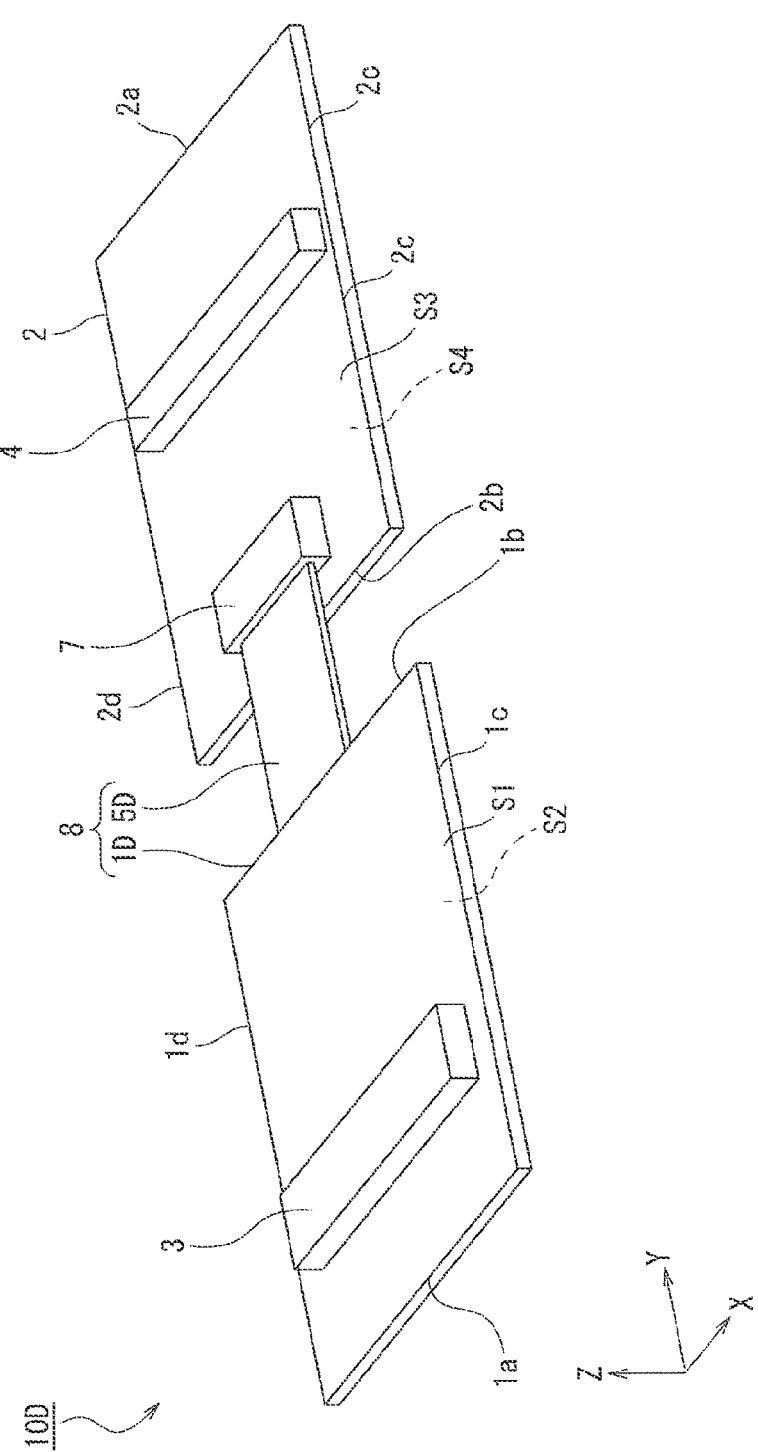
FIG. 9 is a developed view illustrating the configuration example of the multilayer electronic substrate according to the second embodiment of the present technology.

With reference to FIGS. 8 and 9, a second embodiment of the present technology will be described below. A multilayer wiring substrate 10D according to the second embodiment is different from the multilayer wiring substrate 10 according to the first embodiment described above in that a third substrate 8 is included instead of the first substrate 1 and the wiring member 5, and the configuration of the multilayer wiring substrate 10D is basically similar to the configuration of the multilayer wiring substrate 10 according to the first embodiment described above in other respects.

As illustrated in FIG. 8, the third substrate 8 of the second embodiment is a rigid-flexible printed circuit board in which a rigid substrate and a flexible printed circuit (FPC) board are integrated. The third substrate 8 includes a first substrate 1D that is a rigid portion and a wiring member 5D that is a flexible portion and is provided integrally with the first substrate 1D.

As illustrated in FIG. 9 illustrating a state in which the first substrate 1D and the second substrate 2 are separated and the second substrate 2 is unfolded, the first substrate 1D of the third substrate 8 is a rigid portion, and the wiring member 5D of the third substrate 8 is a flexible portion.

The wiring member 5D extends from the end 1b, that is, the other Y-direction end of the first substrate 1D. Each wire in a plurality of wires included in the wiring member 5D is electrically connected to a wire (not illustrated) of the first substrate 1D. Here, the above-described wire of the first substrate 1D electrically connected to the wire of the wiring member 5D is referred to as a second wire in order to be distinguished from the other wires and, in particular, from the first wire. As described above, the wiring member 5D is electrically connected to the second wire of the first substrate 1D without intervention of the third connector 6. Thus, the first substrate 1D does not include the third connector 6.

Furthermore, the other end of each wire of the wiring member 5D is connected to the terminal of the third connector 7 mounted on the front surface S3 of the second substrate 2. The terminal of the third connector 7 connected to the other end of the wire of the wiring member 5D is connected to a wire (not illustrated) of the second substrate 2 on which the third connector 7 is mounted. Here, the above-described wire connected to the terminal of the third connector 7 is referred to as a second wire in order to be distinguished from the other wires and, in particular, from the first wire, of the second substrate 2. As described, the wire of the wiring member 5D is electrically connected to the second wire of the second substrate 2.

Thus, the second wire of the first substrate 1D and the second wire of the second substrate 2 are electrically connected via the wires of the wiring member 5D. Specifically, the second wire of the first substrate 1D and the second wire of the second substrate 2 are electrically connected via the wires of the wiring member 5D and the third connector 7.

Furthermore, the wiring member 5D is provided nearer to the other Y-direction end of the multilayer wiring substrate 10D, specifically, at the end 1b that is the other Y-direction end of the first substrate 1D. Then, in the wiring member 5D, the lengthwise direction is parallel to the Y direction, and the widthwise direction is parallel to the X direction.

The first substrate 1D and the wiring member 5D have the same features as those of the first substrate 1D and the wiring member 5D except for the above-described features.

<Effects>

Also the multilayer wiring substrate 10D according to the second embodiment produces effects similar to those produced by the multilayer wiring substrate 10 according to the first embodiment described above.

Note that, in FIG. 8, the wiring member 5D is provided at the end 1b that is the other Y-direction end of the first substrate 1D, but may be provided at the end 1c that is the one X-direction end of the first substrate 1D or the end 1d that is the other X-direction end of the first substrate 1D. Moreover, the wiring member 5D may be provided at the end 2a that is the one Y-direction end of the second substrate 2, the end 2c that is the one X-direction end of the second substrate 2, or the end 2d that is the other X-direction end of the second substrate 2.

The second embodiment described above may be applied to the first modification, the second modification, and the third modification of the first embodiment, described above.

In the first embodiment and the first to third modifications thereof described above, the third connector 6 is mounted on the front surface S1 of the first substrate 1, but may be mounted on the back surface S2 of the first substrate 1. Furthermore, in the first embodiment, the first to third modifications of the first embodiment, and the second embodiment described above, the third connector 7 is mounted on the front surface S3 of the second substrate 2, but may be mounted on the back surface S4 of the second substrate 2.

Furthermore, in the first embodiment, the first to third modifications of the first embodiment, and the second embodiment described above, two substrates are connected, but three or more substrates may be connected.

Furthermore, the effects described in the present specification are mere examples and are not limitative, and other effects may be provided.

Note that the present technology may have the following configurations.

(1)

A multilayer electronic substrate including:

a first substrate;

a second substrate placed on the first substrate such that surfaces of the first and second substrates face each other;

a first connector mounted on the surface of the first substrate and electrically connected to a first wire of the first substrate;

a second connector mounted on the surface of the second substrate and electrically connected to a first wire of the second substrate, the second connector being directly connected to the first connector; and a wiring member having flexibility, the wiring member having one end electrically connected to a second wire of the first substrate and another end electrically connected to a second wire of the second substrate, to electrically connect the second wire of the first substrate and the second wire of the second substrate.

(2)

The multilayer electronic substrate according to (1), further including a third connector mounted on at least one of the first substrate or the second substrate and electrically connecting at least one of a portion between the second wire of the first substrate and the one end of the wiring member or a portion between the second wire of the second substrate and the another end of the wiring member.

(3)

The multilayer electronic substrate according to (2), in which the third connector is mounted on at least one of the surface of the first substrate or the surface of the second substrate.

(4)

The multilayer electronic substrate according to (3), in which the third connector is mounted on both of the first substrate and the second substrate.

(5)

The multilayer electronic substrate according to (4), in which the third connector mounted on the first substrate and the third connector mounted on the second substrate are provided at positions where the third connectors do not overlap each other along a thickness direction.

17

(6)

The multilayer electronic substrate according to (2), in which the third connector is mounted only on the second substrate.

(7)

The multilayer electronic substrate according to any of (2) to (6), in which a pitch direction of terminals of the third connector is parallel to a pitch direction of terminals of the first connector and a pitch direction of terminals of the second connector.

(8)

The multilayer electronic substrate according to any of (2) to (6), in which a pitch direction of terminals of the third connector is perpendicular to a pitch direction of terminals of the first connector and a pitch direction of terminals of the second connector.

(9)

The multilayer electronic substrate according to any of (2) to (8), in which the wiring member includes a first wiring member and a second wiring member, and a lengthwise direction of the second wiring member is perpendicular to a lengthwise direction of the first wiring member.

(10)

The multilayer electronic substrate according to any of (1) to (8), in which the wiring member includes a first wiring member and a second wiring member, and a lengthwise direction of the second wiring member is parallel to a lengthwise direction of the first wiring member.

The scope of the present technology is not limited to the exemplary embodiments illustrated and described, but includes also all embodiments that produce effects equivalent to the effects that the present technology intends to produce. Moreover, the scope of the present technology is not limited to the combinations of the features of the invention defined by the claims, but can be defined by any desired combination of specific features among all the disclosed features.

REFERENCE SIGNS LIST 1, 1D First substrate
2 Second substrate
3 First connector
4 Second connector
5, 5A, 5B, 5C, 5D Wiring member
6, 6A, 6B, 6C, 7, 7A, 7B, 7C Third connector
8 Third substrate
10, 10A, 10B, 10C, 10D Multilayer wiring substrate

The invention claimed is:

1. A multilayer electronic substrate, comprising:
a first substrate;
a second substrate on the first substrate, wherein a surface of the first substrate faces a surface of the second substrate;
a first connector on the surface of the first substrate, wherein the first connector is configured to electrically connect to a first wire of the first substrate;
a second connector on the surface of the second substrate, wherein
the second connector is configured to electrically connect to a first wire of the second substrate, and
the second connector is directly connected to the first connector; and

a flexible wiring member, wherein
the flexible wiring member includes:
a first end that is electrically connected to a second wire of the first substrate; and
a second end that is electrically connected to a second wire of the second substrate, and
the second wire of the first substrate is electrically connected to the second wire of the second substrate via the flexible wiring member.

2. The multilayer electronic substrate according to claim 1, further comprising at least one third connector on at least one of the first substrate or the second substrate, wherein the at least one third connector is configured to electrically connect at least one of a first portion between the second wire of the first substrate and the first end of the flexible wiring member or a second portion between the second wire of the second substrate and the second end of the flexible wiring member.

3. The multilayer electronic substrate according to claim 2, wherein the at least one third connector is on at least one of the surface of the first substrate or the surface of the second substrate.

4. The multilayer electronic substrate according to claim 3, wherein the at least one third connector is on both of the first substrate and the second substrate.

5. The multilayer electronic substrate according to claim 4, further comprising a fourth connector, wherein
the at least one third connector is on the first substrate,
the fourth connector is on the second substrate, and
the at least one third connector does not overlap the fourth connector along a thickness direction.

6. The multilayer electronic substrate according to claim 1, further comprising a third connector that is on the second substrate, wherein the third connector is configured to electrically connect at least one of a first portion between the second wire of the first substrate and the first end of the flexible wiring member or a second portion between the second wire of the second substrate and the second end of the flexible wiring member.

7. The multilayer electronic substrate according to claim 2, wherein a pitch direction of a plurality of terminals of the third connector is parallel to each of a pitch direction of a plurality of terminals of the first connector and a pitch direction of a plurality of terminals of the second connector.

8. The multilayer electronic substrate according to claim 2, wherein a pitch direction of a plurality of terminals of the third connector is perpendicular to each of a pitch direction of a plurality of terminals of the first connector and a pitch direction of a plurality of terminals of the second connector.

9. The multilayer electronic substrate according to claim 2, wherein
the flexible wiring member includes a first wiring member and a second wiring member, and
a lengthwise direction of the second wiring member is perpendicular to a lengthwise direction of the first wiring member.

10. The multilayer electronic substrate according to claim 1, wherein
the flexible wiring member includes a first wiring member and a second wiring member, and
a lengthwise direction of the second wiring member is parallel to a lengthwise direction of the first wiring member.

* * * * *